United States Patent
Park et al.

(10) Patent No.: US 6,580,775 B1
(45) Date of Patent: Jun. 17, 2003

(54) METHOD OF DETECTING FREQUENCY OF DIGITAL PHASE LOCKED LOOP

(75) Inventors: Hyun-Soo Park, Seoul (KR); Jae-Seong Shim, Seoul (KR); Yong-Kwang Won, Kyungki-do (KR)

(73) Assignee: Samsung Electronics Co., LTD, Suwon (KR)

( * ) Notice: Subject to any disclaimer, the term of this patent is extended or adjusted under 35 U.S.C. 154(b) by 0 days.

(21) Appl. No.: 09/449,735

(22) Filed: Nov. 26, 1999

(30) Foreign Application Priority Data

Nov. 26, 1998 (KR) .............................. 98-50947

(51) Int. Cl.[7] ............................. H03D 3/24
(52) U.S. Cl. .................. 375/375; 375/355; 327/151; 327/162
(58) Field of Search .................. 375/354, 355, 375/362, 364, 374, 375, 376, 373, 282, 333; 370/516, 517, 520; 327/141, 142, 151, 153, 147, 156, 160, 161, 162

(56) References Cited

U.S. PATENT DOCUMENTS

| | | | | |
|---|---|---|---|---|
| 4,546,486 A | * | 10/1985 | Evans | 327/5 |
| 5,297,869 A | * | 3/1994 | Benham | 327/231 |
| 5,299,237 A | * | 3/1994 | Head | 327/141 |
| 5,416,809 A | * | 5/1995 | Masuda et al. | 331/11 |
| 5,594,763 A | * | 1/1997 | Nimishakavi | 327/156 |
| 5,661,425 A | * | 8/1997 | Minoda et al. | 327/147 |
| 5,905,759 A | * | 5/1999 | Ishida et al. | 327/156 |
| 6,154,071 A | * | 11/2000 | Nogawa | 327/147 |
| 6,169,717 B1 | * | 1/2001 | Kim et al. | 369/59.1 |

FOREIGN PATENT DOCUMENTS

| | | |
|---|---|---|
| JP | 1-263565 | 10/1989 |
| JP | 9-5362 | 1/1997 |

* cited by examiner

*Primary Examiner*—Chi Pham
*Assistant Examiner*—Khanh Cong Tran
(74) *Attorney, Agent, or Firm*—Staas & Halsey LLP

(57) ABSTRACT

A method of detecting a frequency of a digital phase locked loop in an optical disc reproduction and/or recording apparatus, which includes (a) detecting an edge point of an input signal, (b) sampling a previous and following input signal on the basis of the detected edge point into a predetermined frequency, (c) counting a number of reference clock signals between the detected edge point and a sample which is positioned previously, adding a count value and an interval of time corresponding to the count value to obtain a frequency count value at the edge point, and (e) comparing the obtained frequency count value with a predetermined reference value, to enhance the frequency according to the comparison result can detect frequency having high resolution with only a reference clock frequency without heightening a frequency of a reference clock signal, to thereby enhance the quality of data. The frequency having the high resolution with only the reference clock frequency without heightening the frequency of the reference clock signal is detected, to thereby enhance the quality of data.

13 Claims, 2 Drawing Sheets

METHOD OF DETECTING FREQUENCY OF DIGITAL PHASE LOCKED LOOP

CROSS-REFERENCE TO RELATED APPLICATIONS

This application claims the benefit of Korean Application No. 98-50947, filed Nov. 26, 1998, in the Korean Patent Office, the disclosure of which is incorporated herein by reference.

BACKGROUND OF THE INVENTION

1. Field of the Invention

The present invention relates to a method of detecting a frequency of a digital phase locked loop in an optical disc recording and/or reproducing apparatus which records and/or reproduces data on/from an optical disc, and more particularly, to a digital phase locked loop frequency detection method in which a low clock frequency is used in a digital phase locked loop, to thus obtain a high resolution.

2. Description of the Related Art

A general reproduction apparatus for an optical disc such as a compact disc (CD) or a digital versatile disc (DVD) requires a process of being synchronized with a reproduction signal from the optical disc. A circuit for performing such a process is called a phase locked loop.

A digital phase locked loop (PLL) includes a frequency detection block, a charge pump control block, a charge pump block, a phase detection block, a frequency divider and a voltage controlled oscillator (referred to as a VCO). Here, the charge pump control block performs pulse width modulation of a frequency detection error. The charge pump block generates a current according to the pulse width modulated frequency detection error. The phase locked loop produces a VCO clock signal oscillating at a constant frequency with respect to an input signal, and then varies the frequency of the VCO clock signal, to be synchronized with the input signal. However, since there is a limit in controlling by just a phase control, a difference between a frequency of the VCO clock signal and the frequency of the input signal is calculated to perform a frequency tracking. Then, if the frequency of the input signal becomes close to a frequency band, a phase control is performed. At this time, in order to heighten the resolution and accuracy of the frequency tracking, a clock having a frequency two times or more than that of a reference clock by using a frequency divider is used to count a binary signal, to thereby perform frequency detection.

Thus, since a frequency higher by a desired resolution than the frequency of an actually required clock signal should be used in order to detect the frequency according to conventional art, the frequency detection is performed at the state where a high-frequency signal is used. However, it is difficult to generate a clock frequency of four times or more according to the current technological status. Also, since analog-to-digital conversion limits an allowable clock frequency, in the case of the digital phase locked loop, a high-frequency higher than the reference clock frequency cannot be used.

SUMMARY OF THE INVENTION

To solve the above problems, it is an object of the present invention to provide a frequency detection method in a digital phase locked loop which can enhance resolution in detecting a reference signal frequency with only a reference clock frequency, without heightening the reference clock frequency.

Additional objects and advantages of the invention will be set forth in part in the description which follows and, in part, will be obvious from the description, or may be learned by practice of the invention.

To accomplish the above and other objects of the present invention, there is provided a frequency detection method of an input signal in a digital phase locked loop, the frequency detection method comprising: (a) detecting an edge point of the input signal; (b) sampling a previous and following input signal of the input signal on the basis of the edge point into a predetermined frequency; (c) counting a number of reference clock signals between the detected edge point and a sample which is positioned previously; (d) adding a count value and an interval of time corresponding to the count value to obtain a frequency count value at the edge point; and (e) comparing the obtained frequency count value with a predetermined reference value, and adjusting the frequency according to the comparison result.

BRIEF DESCRIPTION OF THE DRAWINGS

The above object and other advantages of the present invention will become more apparent by describing the preferred embodiment thereof in more detail with reference to the accompanying drawings, in which.

DETAILED DESCRIPTION OF THE PREFERRED EMBODIMENT

Figure 1:
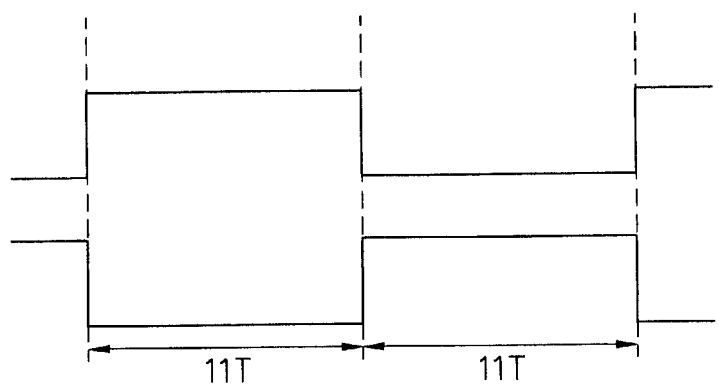
FIG. 1 is a timing diagram showing a sync pattern for a CD.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

In order to detect the frequency of an input signal, it should be checked whether the frequency of a current reference signal, such as an eight-to-fourteen modulation (EFM) signal is high or low. Tracking of the frequency means that a frequency value is changed to synchronize the frequency of a voltage controlled oscillator (VCO) with a reference signal (EFM signal) accurately. The reference signal (EFM signal) has a frequency that is integer times that of a reference clock (T). In the case of a compact disc (CD), the maximum frequency component of a signal configured in a non-return-to-zero form has a period of 3T and the minimum frequency component has a period of 11T. In the case of a digital versatile disc (DVD), the maximum frequency component has a period of 3T and the minimum frequency component has a period of 14T, in which 11T, 12T and 13T do not exist between the maximum frequency component and the minimum frequency component. Here, 11T or 14T is called a frame sync pattern. The CD has a structure which includes an 11T signal every 588T while the DVD has a structure which includes a 14T signal every 1488T.

A sync pattern is used for knowing how far the VCO frequency is from that of the reference signal (EFM signal). A normal DVD has the lowest frequency component of 14T. Here, if a phase locked loop is synchronized, the VCO clock is counted by 14T. Also, the DVD has one sync pattern and the CD has two sync patterns as shown in FIG. 1.

Thus, a single algorithm is applicable to both CDs and DVDs, and any one sync pattern of a high interval or a low interval in a reference signal should be selected. Accordingly, a VCO oscillating clock is counted at a high interval or a low interval from every edge of the reference signal. A frequency difference is detected on the basis of how much a counted value at a maximum for a certain period differs from 11T or 14T. In general, in order to enhance resolution, a frequency of two times the oscillating frequency is used for counting. Then, since 11T or 14T is counted as 22T or 28T, the thus detected frequency difference is precisely doubled. To further enhance resolution, n times the frequency higher than the oscillating frequency is used for counting, which enables n times of an accurate frequency tracking to be performed. However, since an allowable frequency band is limited in the actual circuit, it is difficult to use an oscillating frequency of two times or more. Thus, although a high oscillating frequency is not to be used, values of the data sampled by analog-to-digital conversion are used, to accurately see whether a sign of data is changed at which point within one period of 1T.

Figure 2:
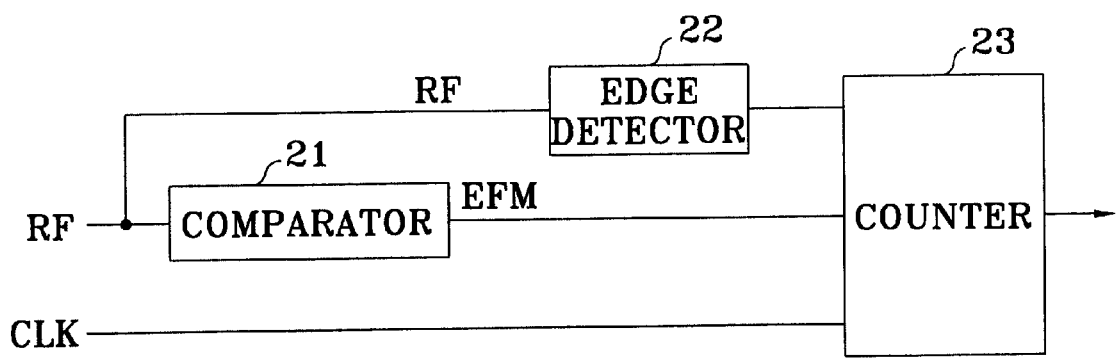
FIG. 2 is a block diagram showing a frequency detection apparatus in a digital phase locked loop circuit adopting a frequency detection method according to an embodiment of the present invention.

FIG. 2 is a block diagram showing a frequency detection apparatus in a digital phase locked loop circuit according to the present invention. In the apparatus shown in FIG. 2, a radio frequency (RF) signal read from an optical disc (not shown) is received by a comparator 21 and an edge detector 22. The comparator 21 binarizes the input RF signal and outputs a reference signal (EFM signal) to a counter 23. The edge detector 22 outputs an edge detection signal to the counter 23 every point where a sign of the input RF signal is changed on the basis of a reference voltage (e.g., when the reference voltage is "0," the edge detection signal is output at a point where a sign of the input RF signal is changed into positive (+) or negative (−). The counter 23 receives a clock signal (CLK) and counts how many clock signals exist in the reference signal output from the comparator 21, according to the edge detection result of the edge detector 22.

The detailed operation of the counter 23 shown in FIG. 2 will be described below with reference to FIGS. 3 and 4.

Figure 3:
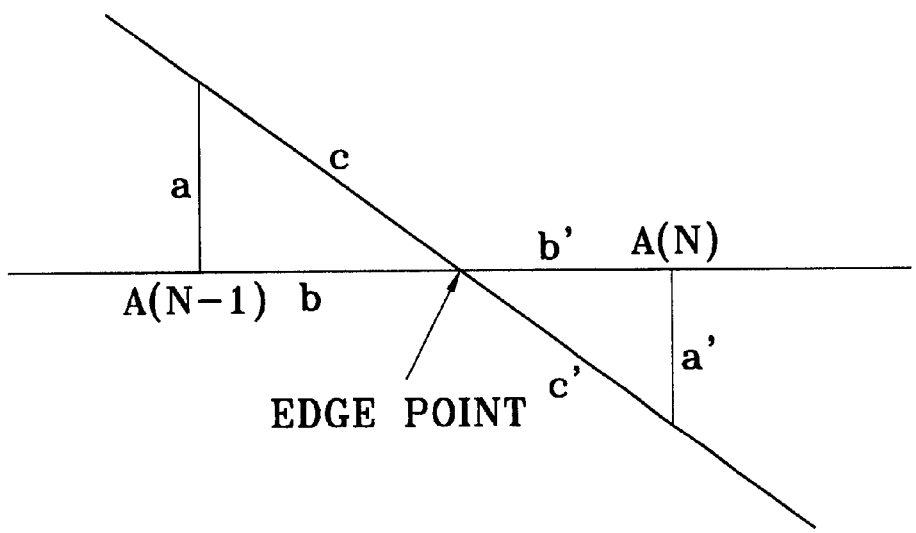
FIG. 3 is a view for explaining an algorithm embodying the frequency detection method according to the embodiment of the present invention.

FIG. 3 is a view for explaining a basic algorithm embodying the method according to the embodiment of the present invention.

It is assumed that data between two items of sample data (e.g., one is a sample value A(N−1) prior to an edge point and the other is a sample value A(N) after an edge point) which are obtained by sampling an RF signal at a predetermined frequency through an analog-to-digital converter (not shown) is linear. The data is shown in FIG. 3.

In FIG. 3, A(N−1) is (N−1)th sample data, and A(N) is Nth sample data. Sample values at the two sample points A(N−1) and A(N) are a and a', respectively. In FIG. 3, it can be seen that a triangle abc and a triangle a'b'c' are similar triangles. Thus, an equation a:b:c=a':b':c' is established between three sides corresponding to each other. Thus, an interval of time between the two samples is represented by b+b'. If the sample values of a and a' are known, b and b' can be obtained by the following equations.

$$b = a/(a+a')(b+b')$$

$$b' = a'/(a+a')(b+b')$$

Here, a, a', b and b' are all absolute values, and b+b' is 1.

Thus, if a point at which the sign of the sample data is changed is an edge point, a value of b is added to a count value counted up to the present at the edge point and the added result is output. Then, if a newly starting counter starts from a value of b', a frequency value can be tracked by an accurate value although only a clock frequency is used. That is, it can be seen that a frequency count value equals a previous frequency value+b and a new count value equals b'.

Figure 4:
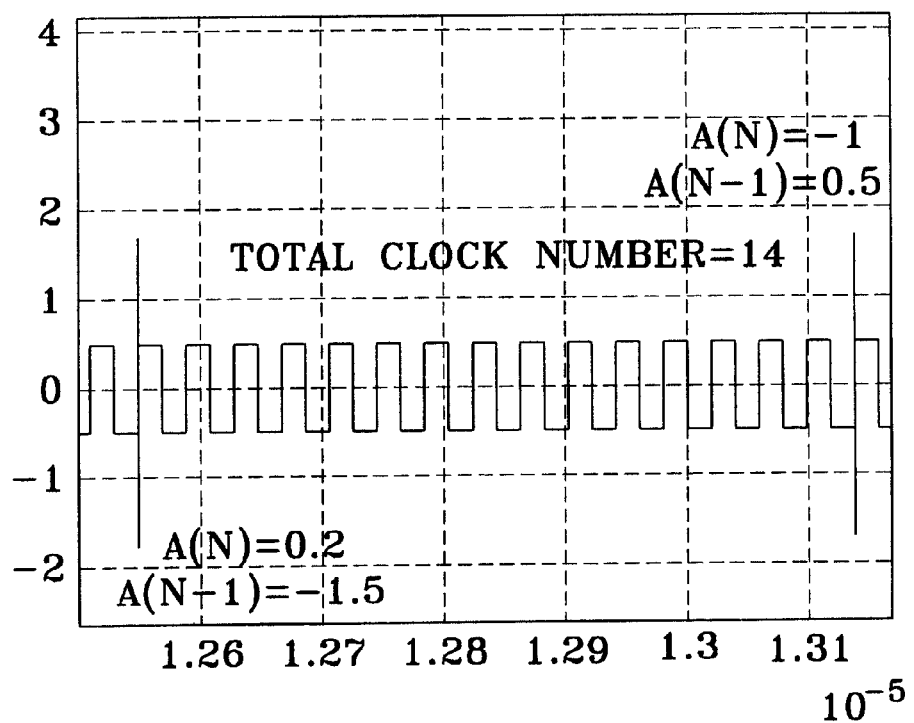
FIG. 4 is a graphical view for explaining the frequency detection method according to the embodiment of the present invention which uses the algorithm shown in FIG. 3.

FIG. 4 is a graphical view for explaining the embodiment of the present invention which uses the algorithm shown in FIG. 3.

Assuming that values of sample data A(N) and A(N−1) are 0.2 and −1.5 at the first edge point, respectively, the frequency count value is obtained by the following equation 1.

$$\text{Frequency count value} = \text{Previous frequency count value} + 1.5/(0.2+1.5) \quad (1)$$

Here, a new starting frequency count value of the counter 23 becomes 0.2/(0.2+1.5)=0.1176.

Assuming that values of sample data A(N) and A(N−1) are −1 and 0.5 at the second edge point, respectively, the frequency count value is obtained by the following equation 2.

$$\text{Frequency count value} = 0.1176 + 0.5/(0.5+1) = 0.4509 \quad (2)$$

Here, a new starting frequency count value of the counter 23 becomes 1/(0.5+1)=0.6667.

Thus, in the case of the waveform shown in FIG. 4, the output value of the frequency detection is 14.4506, of which the oscillating frequency is higher than 14T. Accordingly, it is obvious that the oscillating frequency of the next edge point should be lowered to keep synchronization.

As described above, the present invention can detect a frequency having a high resolution with only a reference clock frequency without heightening a frequency of a reference clock signal, to thereby enhance the quality of data.

What is claimed is:

1. A frequency detection method of an input signal in a digital phase locked loop, the frequency detection method comprising:

detecting an edge point of the input signal;

sampling previous and following input signals of the input signal based upon the detected edge point into a predetermined frequency;

counting a number of reference clock signals between the detected edge point and the previous input signal;

adding a count value and an interval of time corresponding to the count value to obtain a frequency count value at the edge point; and comparing the obtained frequency count value with a predetermined reference value, and adjusting the frequency of the input signal according to the comparison result.

2. The frequency detection method of claim 1, wherein the sampling of the previous and following input signals comprises sampling the previous and following input signals at a frequency of said reference clock signal.

3. The frequency detection method of claim 1, wherein the adding of a count value and an interval of time comprises:

calculating the interval of time from a prior-to-the-edge-point sample data to the edge point; and adding the frequency count value up to the edge point and the interval of time from the prior-to-the-edge-point sample data to the edge point, which is the frequency count value at the edge point.

4. The frequency detection method of claim 3, further comprising:

calculating the interval of time from the edge point to a post-to-the-edge-point sample data;

wherein the frequency of the input signal is counted at an initial value of a frequency count at a next edge point using the interval of time from the edge point to the post-to-the-edge-point sample data.

5. The frequency detection method of claim 1, wherein data between two samples of the input signal which are obtained prior to and past the edge point, based upon of the edge point, is linear.

6. A method of determining a frequency of an input signal based only upon a frequency of a reference clock, comprising:

counting a number of pulses of a reference clock signal between a current edge point and a previous edge point of a binarized input signal;

sampling a previous data point and a following data point relative to the current edge point of an input signal; and adding an interval of time between the previous data point and the current edge point to the number of pulses to determine a frequency count value at the edge point.

7. The frequency detection method of claim 6, wherein the determining of the frequency of the digital phase locked loop comprises:

detecting the edge point of the input signal, to produce an edge detection signal;

binarizing the input signal, to produce a reference signal; and wherein the counting of the number of pulses of the reference clock in the binarized input signal includes counting the number of pulses in the reference signal.

8. A frequency detection method of an input signal in a digital phase locked loop, comprising:

determining a frequency of the digital phase locked loop based only upon a frequency of a reference clock, wherein the determining of the frequency of the digital phase locked loop comprises:

detecting an edge point of the input signal, to output an edge detection signal;

binarizing the input signal, to output a reference signal;

counting a number pulses of the reference clock in the reference signal, for the detection of the edge point in the edge detection signal;

sampling previous and following data points relative to a current data point of the input signal, based upon the detected edge point;

adding a count value and an interval of time corresponding to the count value, to determine a frequency count value at the edge point; and comparing the frequency count value with a predetermined reference value, and adjusting the frequency of the digital phase locked loop based upon the comparison.

9. A frequency detection method of an input signal in a digital phase locked loop, comprising:

determining a frequency of the digital phase locked loop based only upon a frequency of a reference clock, wherein the determining of the frequency of the digital phase locked loop comprises:

detecting an edge point of the input signal, to output an edge detection signal;

binarizing the input signal, to output a reference signal;

counting a number pulses of the reference clock in the reference signal, for the detection of the edge point in the edge detection signal;

sampling previous and following data points relative to a current data point of the input signal, based upon the detected edge point;

determining a current frequency count value based upon the equation:

current frequency count value=a previous frequency count value+ $abs(A(N-1))/(absA(N)+abs(A(N-1)))$, wherein A(N−1) is a value of the previous data point and A(N) is a value of the following data point; and comparing the current frequency count value with a predetermined reference value, and adjusting the frequency of the digital phase locked loop based upon the comparison.

10. The frequency detection method of claim 9, wherein the predetermined reference value is based upon a period of 14T for a digital video disc.

11. The frequency detection method of claim 9, wherein the predetermined reference value is based upon a period of 11T for a compact disc.

12. The frequency detection method of claim 9, wherein data of the input signal between the previous and following data points is linear.

13. A method of determining a frequency of an input signal based only upon a frequency of a reference clock, comprising:

counting a number of pulses of a reference clock signal between a current edge point and a previous edge point of a binarized input signal;

sampling a previous data point and a following data point relative to the current edge point of an input signal; and determining a current frequency count value based upon the equation:

current frequency count value=a previous frequency count value+ $abs(A(N-1))/(absA(N)+abs(A(N-1)))$, wherein A(N−1) is a value of the previous data point and A(N) is a value of the following data point.

* * * * *